(12) United States Patent
Yamashita et al.

(10) Patent No.: US 6,456,062 B2
(45) Date of Patent: Sep. 24, 2002

(54) CONTACT ARM AND ELECTRONIC DEVICE TESTING APPARATUS USING THE SAME

(75) Inventors: Tsuyoshi Yamashita; Toshiyuki Kiyokawa, both of Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/885,913

(22) Filed: Jun. 22, 2001

(30) Foreign Application Priority Data

Jun. 23, 2000 (JP) ........................................ 2000-188981

(51) Int. Cl.[7] ................................................. G01R 1/16
(52) U.S. Cl. ..................... 324/158.1; 324/754; 324/760; 324/765; 414/403; 702/108
(58) Field of Search ............................ 324/73.1, 158.1, 324/537, 700, 705, 754, 755, 758, 760, 765; 702/108; 438/14, 18; 414/403; 374/57; 361/700, 704, 718; 209/571, 573; 165/80.3, 80.4

(56) References Cited

U.S. PATENT DOCUMENTS 5,742,168 A * 4/1998 Kiyokawa .................. 324/754
5,986,460 A * 11/1999 Kawakami .................. 324/765
6,075,373 A * 6/2000 Iino ........................... 324/754
6,313,653 B1 * 11/2001 Takahashi ................... 324/760

* cited by examiner

*Primary Examiner*—Michael Sherry
*Assistant Examiner*—Trung Nguyen
(74) *Attorney, Agent, or Firm*—Birch, Stewart, Kolasch & Birch, LLP

(57) ABSTRACT

A contact arm for bringing ICs to be tested to contact a contact portion, comprises a holding head for holding said electronic devices, a floating mechanism provided between a drive mechanism for moving close to or away from said contact portion and said holding head for supporting said holding head movable about said drive mechanism, a diaphragm cylinder provided between said drive mechanism and said holding head for adjusting a relative pressing pressure from said drive mechanism to said holding head. A plurality of diaphragm cylinders are provided to one holding head.

8 Claims, 5 Drawing Sheets

CONTACT ARM AND ELECTRONIC DEVICE TESTING APPARATUS USING THE SAME

BACKGROUND OF THE INVENTION

1. Field of the Invention

The present invention relates to an electronic device testing apparatus for testing a semiconductor integrated circuit element and other variety of electronic devices (hereinafter, also representatively referred to as an IC), particularly relates to a contact arm for holding electronic devices to be tested and bringing them to contact a contact portion.

2. Description of the Related Art

In an electronic device testing apparatus called a handler, a large number of ICs to be tested are conveyed to inside the handler, where the ICs are brought to electrically contact a test head and a test is conducted by an electronic device testing apparatus body (hereinafter, also referred to as a tester). Then, when the test is ended, the ICs are taken out from the test head and reloaded to trays in accordance with the test results, so that sorting to categories, such as good ones and defective ones, is performed.

As a contact arm applied to an electronic device testing apparatus of the related art, there are known two types shown in FIG. 5A and FIG. 5B.

A contact arm 105d shown in FIG. 5A comprises a holding head D1 attached to a Z-axis drive mechanism 105c and the holding head D1 is buried a heater D4 for maintaining high temperature thermal stress applied to ICs to be tested. A pressure of pressing of the ICs to be tested against a contact portion 201 is managed by controlling a motor (not illustrated) provided to the Z-axis drive mechanism 105c.

On the other hand, a contact arm 105d shown in FIG. 5B is provided with a spring D6 between the Z-axis drive mechanism 105c and the holding head D1, and a relative inclination of the holding head D1 and the contact portion 201 can be absorbed by the spring D6.

However, the above two types of contact arms 105d had disadvantages as below.

Namely, since the contact arm 105d does not have a floating mechanism by the spring D6 shown in FIG. 5B, a relative inclination of the holding head D1 and a contact portion 201 has to be adjusted by lying a shim etc. between the Z-axis drive mechanism 105c and the holding head D1. In a mechanical adjusting method by a shim, etc., however, it is difficult to sufficiently follow the relative inclination of the holding head D1 and the contact portion 201.

Although this type of contact arm 105d does have an ability of managing the pressure for pressing by motor controlling, ICs to be tested requiring pressure management are inevitably severe on an error of inclination and an accurate test cannot be conducted if the inclination adjustment is not suitably performed. Furthermore, since the pressure management is controlled by one motor, the case where a plurality of ICs to be tested are pressed by one holding head cannot be handled.

Also, even it is possible for the contact arm 105d shown in FIG. 5B to correct relative inclination of the holding head D1 and the contact portion 201 by the floating mechanism of the spring D6, the holding head D1 does not have any space for burying the heater D4 due to the spring D6 lying there, and if the heater D4 is provided on the Z-axis drive mechanism 105c side, the spring D6 ends up blocking the heat. Accordingly, this type of contact arm was able to be applied only to handlers of a chamber type which had problems in maintenance and costs. Also, inclination can be corrected by the spring D6, but the pressure management cannot be attained because the final pressing force is a force by the spring D6.

SUMMARY OF THE INVENTION

An object of the present invention is to provide a contact arm capable of separately performing stroke management and pressure management, easily adjusting inclination and furthermore flexibly dealing with changes of a socket arrangement and an amount measured at a time and an electronic device testing apparatus.

According to a first aspect of the present invention, there is provided a contact arm for an electronic device testing apparatus for bringing electronic devices to be tested to contact a contact portion, comprising a holding head for holding said electronic devices; a floating mechanism provided between a drive mechanism for moving close to or away from said contact portion and said holding head, for supporting said holding head movable about said drive mechanism; a hydrostatic pressure cylinder provided between said drive mechanism and said holding head, for adjusting a relative pressing pressure from said drive mechanism to said holding head.

In the above invention, it is not specifically limited, but preferably, a plurality of the hydrostatic pressure cylinders are provided to one holding head.

Also, it is not specifically limited in the above invention, but preferably, the floating mechanism includes a rod for supporting said holding head and a through hole formed on said drive mechanism side for said rod to penetrate; and said one rod is provided with said one hydrostatic pressure cylinder.

Furthermore, it is not specifically limited in the above invention, but at least a holding portion of an electronic device to be tested of said holding head is made removable.

According to a second aspect of the present invention, there is provided a change kit constituting the holding portion of the electronic device to be tested made to be a shape to hold the electronic device to be tested in accordance with an arrangement and/or a amount of said contact portion.

Also, there is provided a change kit constituting the rod and holding head made to be a shape in accordance with an arrangement and/or amount of said contact portion.

According to a third aspect of the present invention, there is provided an electronic device testing apparatus comprising the contact arm or the change kit.

In the present invention, the floating mechanism enables the holding head to move about the drive mechanism, and furthermore, a relative pressing pressure from the drive mechanism to the holding head can be adjusted by the hydrostatic pressure cylinder. Therefore, pressure management can be attained by adjusting the pressing pressure of the holding head by the hydrostatic pressure cylinder.

Furthermore, by providing a plurality of hydrostatic pressure cylinders to one holding head and adjusting a pressing pressure of the respective hydrostatic pressure cylinders, it is possible to correct relative inclination of the contact portion and the holding head.

Also, by setting the pressing pressure by the hydrostatic pressure cylinder a certain value, stroke management by the drive mechanism can be attained.

Furthermore, when configuring at least the IC holding portion of the holding head removable, it is possible to deal with specifications of an arrangement and amount of the contact portion as such by exchanging only the IC holding portion formed in accordance with an arrangement and amount of the contact portion.

Also, when a rod is configured removable from the drive mechanism, it is possible to deal with specifications of an arrangement and amount of the contact portion by exchanging the rod and holding head.

BRIEF DESCRIPTION OF THE DRAWINGS

These and other objects and features of the present invention will be explained in more retail below with reference to the attached drawings, wherein.

DESCRIPTION OF THE PREFERRED EMBODIMENTS

Figure 1:
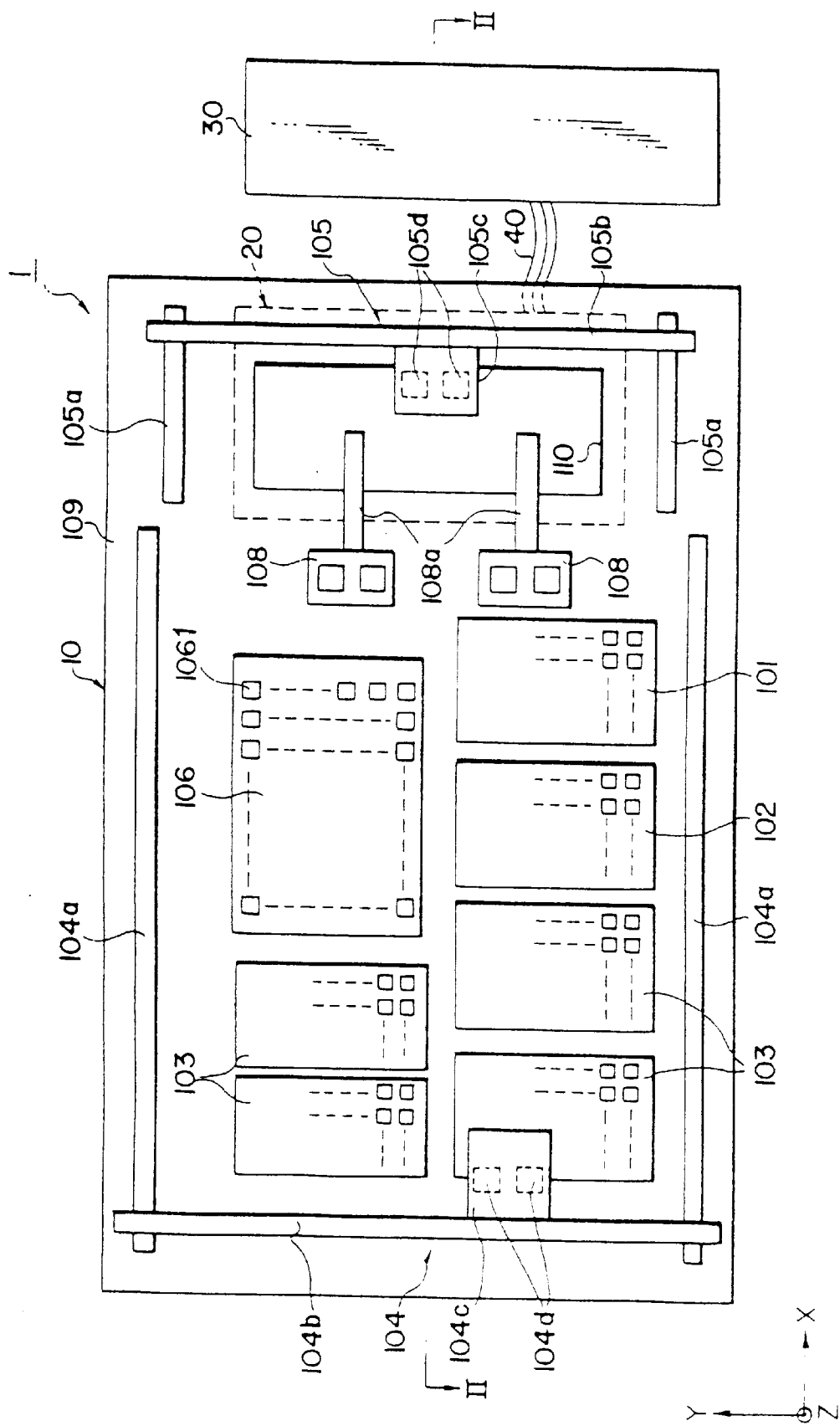
FIG. 1 is a plan view of an embodiment of an electronic device testing apparatus of the present invention.
Figure 2:
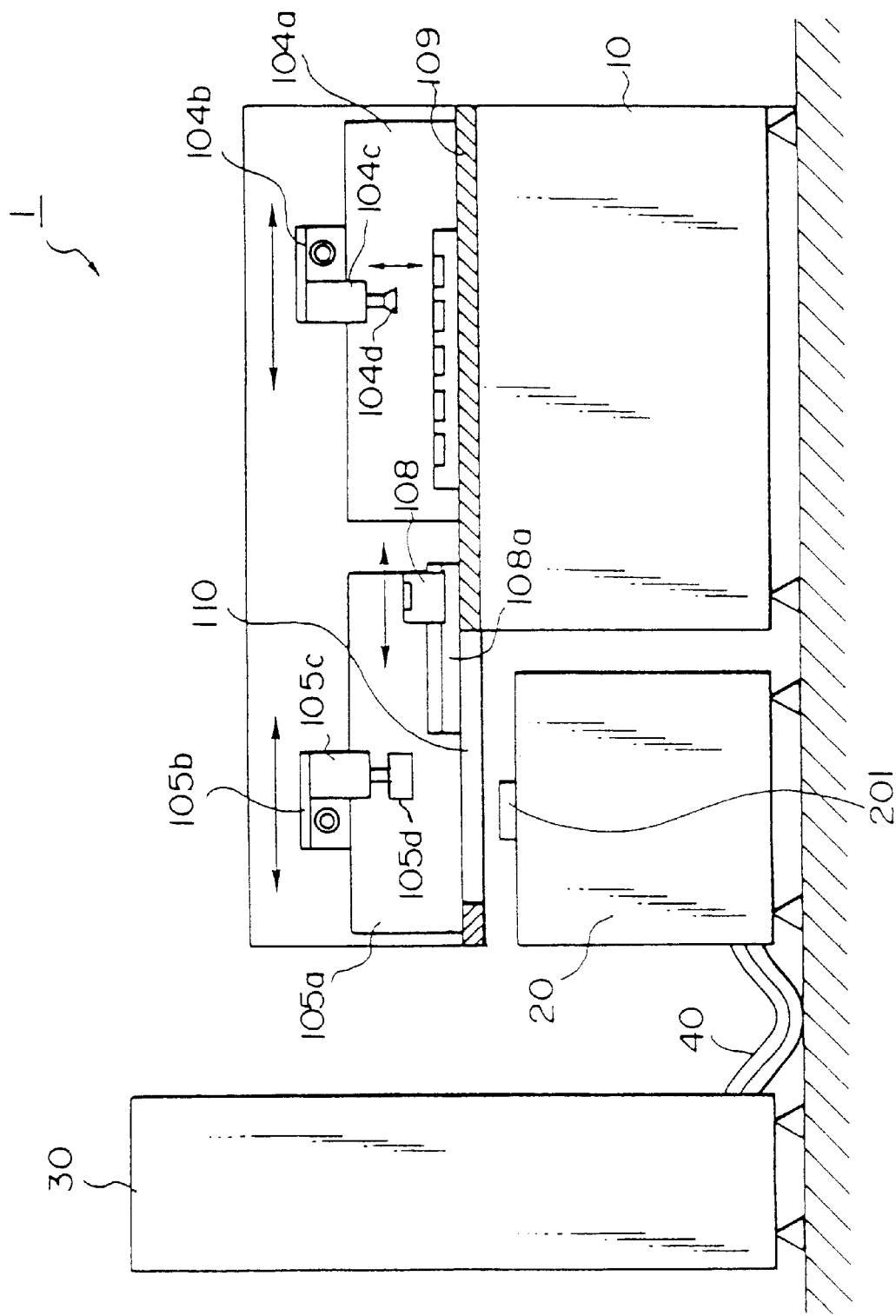
FIG. 2 is a sectional view along the line II—II in FIG. 1.

As shown in FIG. 1 and FIG. 2, an electronic device testing apparatus 1 of the present embodiment comprises a handler 10, a test head 20 and a tester 30, and the test head 20 and the tester 30 are connected via a cable 40. Pre-test ICs to be tested mounted on a supply tray 102 of the handler 20 are pressed against a contact portion 201 of the test head 20 by XY-conveyors 104 and 105, a test of the ICs is conducted via the test head 20 and the cable 40, then, the tested ICs are stored on sorting tray 103 in accordance with the test results.

The handler 10 is provided with a substrate 109, on which the XY-conveyors 104 and 105 of the ICs to be tested are provided. Also, an opening 110 is formed on the substrate 109, and through which, the ICs to be tested are pressed against the contact portion 201 of the test head 20 arranged on the backside of the handler 10 as shown in FIG. 2.

On the substrate 109 of the handler 10 is provided with two sets of XY-conveyors 104 and 105. The XY-conveyor 104 among these is configured so that an IC suction apparatus 104d attached to a mount base 104c can move in a region from the sorting tray 103 to the supply tray 102, an empty tray 101, a heat plate 106 and two buffer portions 108 and 108 by rails 104a and 104b respectively provided along the X-axis direction and Y-axis direction, furthermore, a pad of the IC suction apparatus 104d is movable in the Z-axis direction, that is in the up-down direction, by a not shown Z-axis actuator. The two IC suction apparatuses 104d provided on the mount base 104c enable to pick up, convey and release two ICs to be tested at a time.

On the other hand, the XY-conveyor 105 is configured so that the IC suction apparatus 105d attached to a mount base 105c can move in a region between the two buffers 108 and 108 and the test head 20 by rails 105a and 105b respectively provided along the X-axis direction and Y-axis direction, furthermore, a pad of the IC suction apparatus 105d is movable in the Z-axis direction (that is, in the up-down direction) by a not shown Z-axis actuator. The two IC suction apparatuses 105d provided on the mount base 105c enable to pick up, convey and release two ICs to be tested at a time.

Note that the XY-conveyor 105 is for pressing the ICs to be tested against the contact portion 201, the IC suction apparatus 105d will be also referred to as a contact arm 105d below. Also, the mount base 105c includes the Z-axis actuator moving up and down in the Z-axis direction, and thereby, the whole mount base 105c is to move approaching and away from the contact portion 201. This corresponds to the drive mechanism of the present invention.

Two buffer portions 108 and 108 move back and forth between an operation region of the two XY-conveyors 104 and 105 by the rail 108a and a not shown actuator. The buffer portion 108 at an upper side in FIG. 1 transfers the ICs to be tested conveyed from the heat plate 106, while the buffer portion 108 at the lower side takes out the ICs tested by the test head 20. Due to the two buffer portions 108 and 108, the two XY-conveyors 104 and 105 can operate at a time without interfering to each other.

In the operation region of the XY-conveyor 104, there arranged the supply tray 102 loaded with pre-test ICs, four sorting trays 103 to which the tested ICs are sorted in accordance with the test results and stored and an empty tray 101, furthermore, a heat plate 106 is provided at a position close to the buffer portion 108.

The heat plate 106 is for example a metal plate on which a plurality of indentations 1061 for being dropped the ICs to be tested are formed. The pre-test ICs from the supply tray 102 are transferred to the indentations 1061 by the XY-conveyor 104. While not illustrated, a heating element for applying a predetermined thermal stress to the ICs to be tested is provided on the lower surface of the heat plate 106. The ICs to be tested are heated to a predetermined temperature by a heat from the heating element 107 conveyed via the heat plate 106, then, pressed against the contact portion 201 of the test head 20 via one buffer portion 108.

Figure 3A:
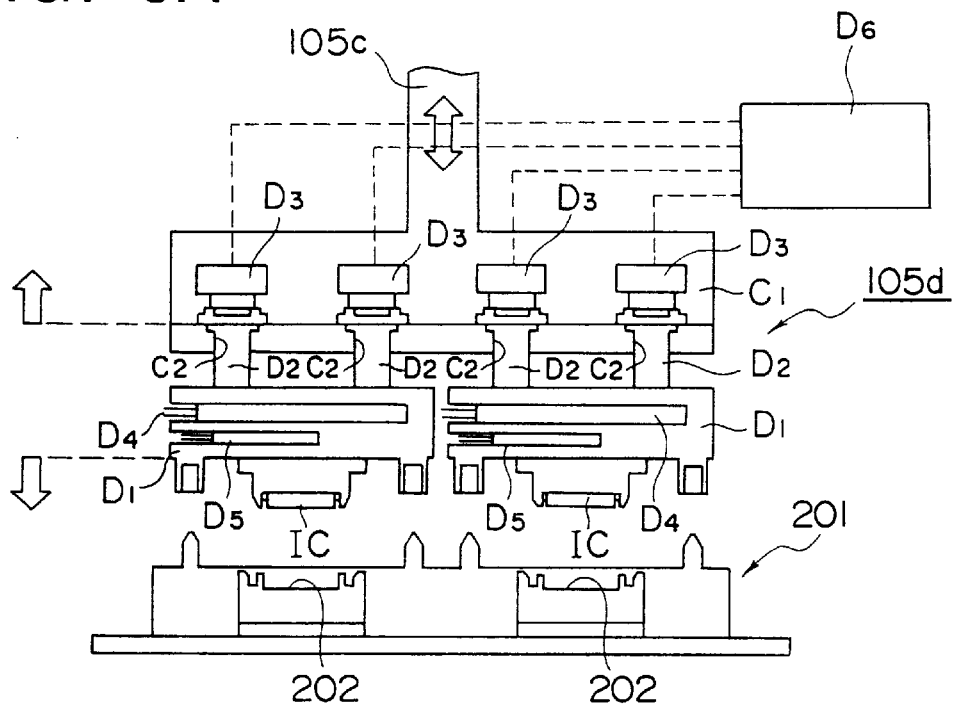
FIG. 3A and FIG. 3B are a sectional view and a plan schematic view of an embodiment of a contact arm of the present invention.
Figure 3B:
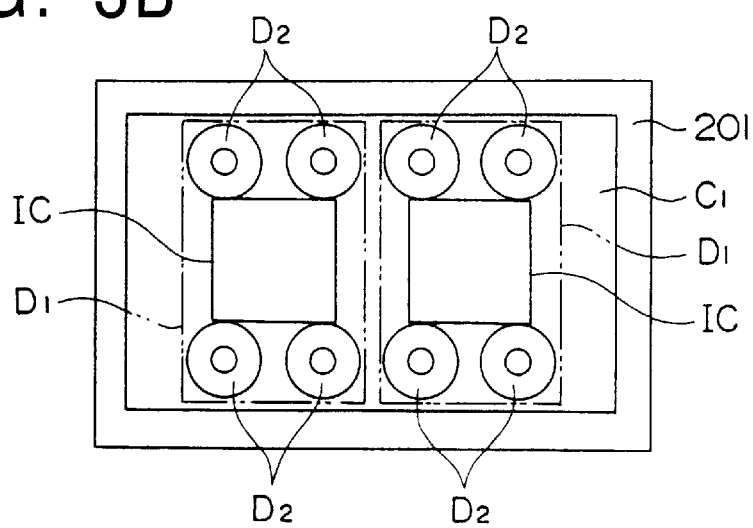

Specifically, the contact arm 105d of the present embodiment is configured as shown in FIG. 3A and FIG. 3B.

Namely, a total of eight through holes C2 are formed on a base block C1 provided at an lower end of the mount base 105c and each of the through holes C2 is inserted a rod D2 leaving a slight space. Since the upper end of the rod D2 has a larger diameter than that of the through hole C2, the rod D2 is to be supported by the base block C1. Since the above explained space is formed in the through hole C2, the rod D2 is movable about the base block C1. This constitutes the floating mechanism according to the present invention.

As shown in FIG. 3B, one holding head D1 is supported by four rods D2, and one mount base C1 is provided with two holding heads D1 in this example.

The holding head D1 comprises a heater D4 buried therein, which maintains a temperature of the picked up and held ICs to be tested. A temperature sensor D5 is also buried therein, which detects a temperature of the holding head D1 to indirectly detect the temperature of the ICs to be tested and supplies it to on/off controlling of the heater D4, etc.

In the present embodiment, a diaphragm cylinder D3 (corresponding to the hydrostatic pressure cylinder according to the present invention) for giving a pressing pressure to the upper end of every rod D2 is provided to the base block C1. In an example in FIG. 3B, the diaphragm cylinder D3 is provided to each of the all eight rods D2 and the diaphragm cylinders are controlled by respectively provided precision regulators D6. Namely, the pressing pressure against the respective rods D2 is made adjustable by controlling the respective diaphragm cylinder D3 in the present example. Note that while one precision regulator D6 is shown in FIG. 3A, the precision regulators D6 are actually provided for the number in accordance with the number of diaphragm cylinders D3.

In the contact arm 105d of the present example, two ICs to be tested are held by the two holding heads D1 and D1 as shown in FIG. 3B, and a test is conducted by pressing the two ICs against the contact portion 201 at a time. Namely, it is a contact arm of measuring two at a time.

Note that the contact arm 105d of the present invention is not limited to the one measuring two at a time and able to suitably handle in accordance with an arrangement of the IC sockets 202 of the contact portion 201. Namely, the holding head D1 and rod D2 ("a simultaneous measurement handling portion" in FIG. 3A) are made removable and by exchanging the holding head D1 and rod D2, it is possible to handle the arrangement of the IC sockets 202 of the contact portion 201 for example as shown in FIG. 4A to FIG. 4F.

Figure 4A:
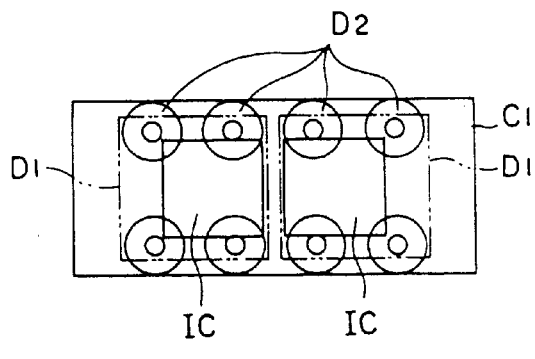
FIG. 4A to FIG. 4F are plan schematic views of an embodiment of a change kit of the present invention.
Figure 4B:
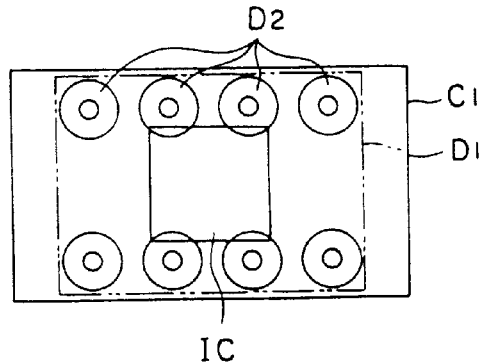
Figure 4C:
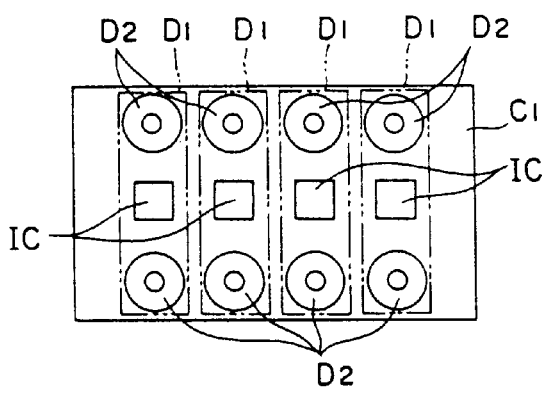
Figure 4D:
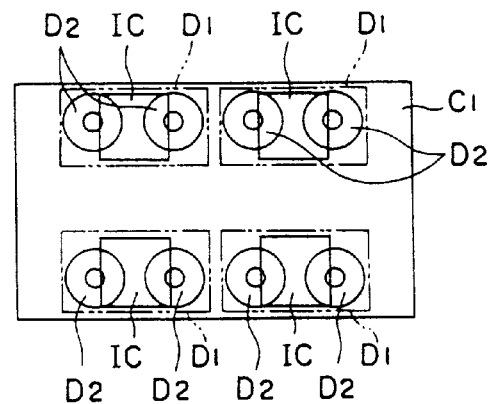
Figure 4E:
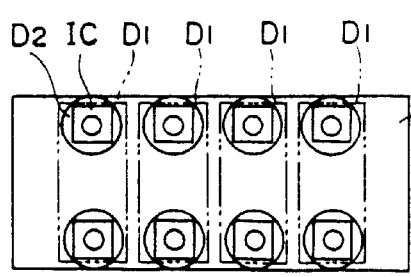
Figure 4F:
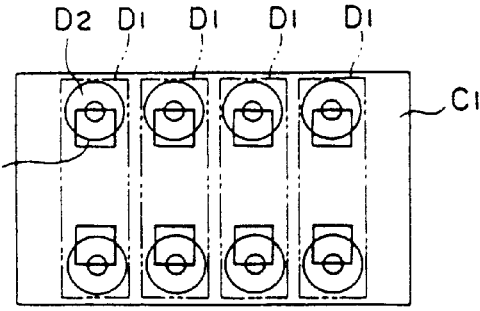
Figure 5A:
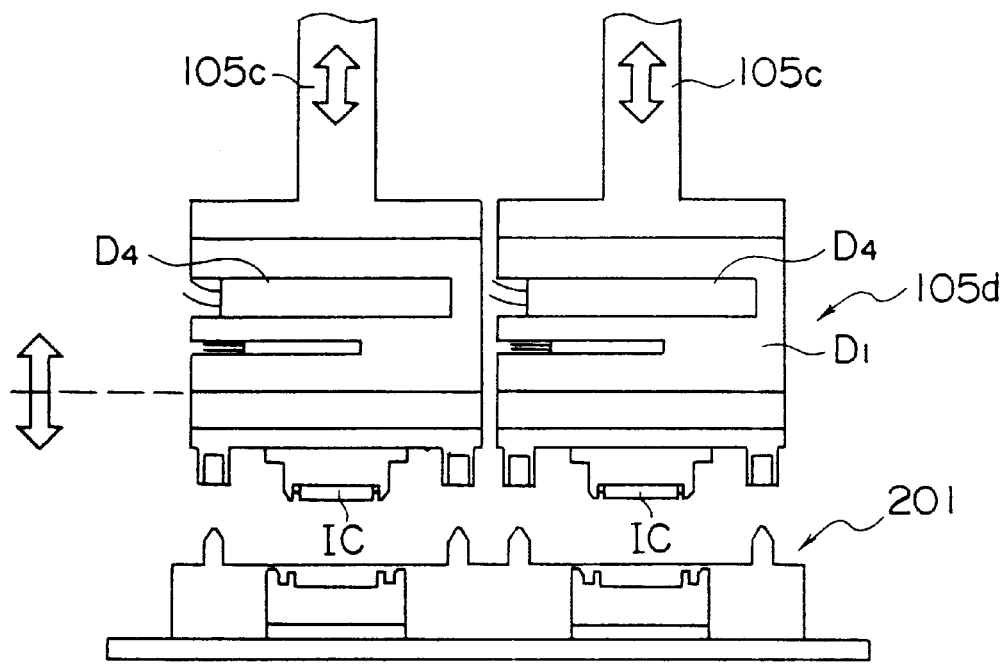
FIG. 5A and FIG. 5B are sectional views of a contact arm of the related art.
Figure 5B:
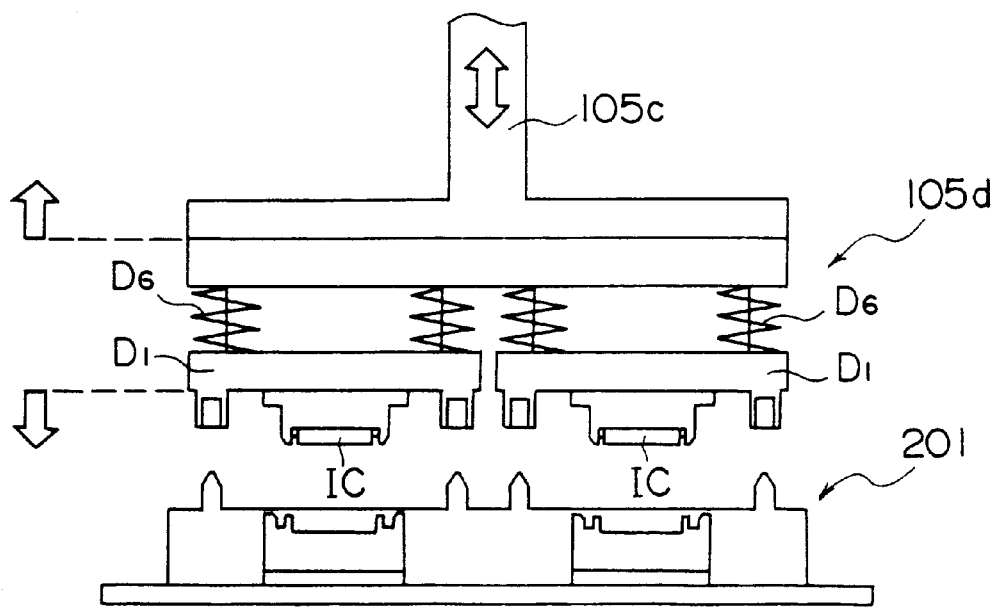

In FIG. 4A to FIG. 4F, the arrangement is the same as those measuring two at a time shown in FIG. 4A, FIG. 3A and FIG. 3B, but a distance between the two IC sockets 202 is shorter than examples shown in FIG. 3A and FIG. 3B. FIG. 4B is for measuring only one IC to be tested and one holding head D1 is supported by eight rods D2. The arrangements in FIG. 4C and FIG. 4D are for measuring four at a time and each of the four holding heads D1 is supported by two rods D2. In an example in FIG. 4C, one holding head D1 is supported by rods D2 adjacent to each other in a vertical direction, while in an example in FIG. 4D, one holding head D1 is supported by rods D2 adjacent to each other in a horizontal direction. Also, arrangements in FIG. 4E and FIG. 4F are for measuring eight at a time and configured that each of the four holding head D1 holds two ICs to be tested.

Note that the distance between the rods D2 in the vertical direction is different in the examples shown in FIG. 4E and FIG. 4F, wherein the rods D2 in FIG. 4E are arranged in the same way as the rods D2 in FIG. 4A, and the rods D2 in FIG. 4F are arranged in the same way as the rods D2 in FIG. 4B to FIG. 4D. Accordingly, as to those in the examples shown in FIG. 4A and FIG. 4E and those in the examples shown in FIG. 4B, FIG. 4C, FIG. 4D and FIG. 4F, it is sufficient to change a portion lower than the holding head D1 in each case.

Also, the lower end portion ("a kind handling portion" in FIG. 3A) of the holding head D1 is made removable and exchanged with an exclusive part in accordance with the amount and arrangement of holding ICs to be tested.

An operation will be explained next.

Pre-test ICs loaded on the supply tray 102 of the handler 10 are picked up and held by the X–Y conveyor 104 and transferred to indentations 106a of the heat plate 106. The ICs are brought to a predetermined temperature by being left here for a predetermined time. The X–Y conveyor 104 which transferred the ICs from the supply tray 102 to the heat plate 106 before rising temperature releases the ICs, picks up and holds the ICs brought to a predetermined temperature by being left on the heat plate 106 as they are, and transfers to the buffer portion 108.

The buffer portion 108 to which the ICs are transferred moves to a right end of the rail 108a, picked up and held by the X–Y conveyor 105 and pressed against the IC sockets 202 of the test head 20 through the openings 110 on the substrate 109 as shown in FIG. 3A and FIG. 3B.

Here, the mount base 105c is lowered while supplying an air having a maximum air pressure from the respective precision regulators D6 to the respective diaphragm cylinders D3 so as to detect a terminal of the IC socket 202 or an upper surface of a socket guide. The detection of the terminal of the IC socket 202 or the upper surface of the socket guide may be performed by a torque limiter of a servo motor for moving the mount base 105c up and down or a proximity sensor.

When the terminal of the IC socket 202 or the upper surface of socket guide is detected, an actual operation of a test of the ICs starts. Here, the operations are as below in the case of a stroke management method and the case of a pressure management method as contact operation modes.

First, when applying the stroke management method, a terminal displacement amount set in advance is added to a stroke to the terminal of the IC socket 202 or the upper surface of the socket guide to press against the contact portion 201. At this time, an air having the maximum pressure is supplied to the respective diaphragm cylinder D3.

On the other hand, when applying the pressure management method, the mount base 105c is slightly lowered with respect to a stroke to the terminal of the IC socket 202 or the upper surface of the socket guide, then, an air pressure set in advance in accordance with a reaction force of the terminal of the IC socket 202 is supplied from the respective precision regulators D6 to the respective diaphragm cylinders D3. The set air pressure at this time is made to be a value in accordance with the arrangement and amount of the IC sockets and the arrangement and amount of the ICs to be tested picked up and held by the holding head D1.

When a contact failure arises during the above contact operation, it is handled as below.

First, in the case of the stroke management method, the contact stroke amount until then is gradually increased to where a contact failure ceases to arise. At this time, if the total contact stroke amount exceeds the upper limit value, an abnormal alarm goes off at the point.

On the other hand, in the case of the pressure management method, the air pressure supplied to the diaphragm cylinder is gradually raised to where a contact failure ceases to arise. At this time, if the air pressure exceeds the upper limit value, an abnormal alarm goes off at the point.

As explained above, in the contact arm 105d of the present embodiment, the floating mechanism comprised of the base block C1 and the rod D2 enables the holding head D1 to move about the mount base 105c and a relative pressing pressure from the mount base 105c to the holding head D1 is adjustable by the diaphragm cylinder D3, so pressure management can be attained by adjusting the pressing pressure to the rod D2 by the precision regulator D6 and diaphragm cylinder D3.

Furthermore, since a plurality of diaphragm cylinders D3 are provided to one holding head D1, it is possible to correct relative inclination of the contact portion 201 and the holding head D1 by adjusting the pressing pressure of the respective diaphragm cylinders D3.

Also, by setting the pressing pressure by the diaphragm cylinders D3 constant, stroke management can be performed.

Furthermore, when the holding head D1 is configured to be removable, it is possible to deal with specifications of an arrangement and amount of the contact portion 201 as shown in FIG. 4A to FIG. 4F by exchanging the kind handling portion or the simultaneous measurement handling portion.

Note that the embodiments explained above were described to facilitate the understanding of the present invention and not to limit the present invention. Accordingly, elements disclosed in the above embodiments include all design modifications and equivalents belonging to the technical field of the present invention.

What is claimed is:

1. A contact arm for an electronic device testing apparatus for bringing electronic devices to be tested to contact a contact portion, comprising:

a holding head for holding said electronic devices to be tested;

a floating mechanism provided between a drive mechanism for moving close to or away from said contact portion and said holding head, for supporting said holding head movable about said drive mechanism;

a hydrostatic pressure cylinder provided between said drive mechanism and said holding head, for adjusting a relative pressing pressure from said drive mechanism to said holding head.

2. The contact arm for an electronic device testing apparatus as set forth in claim 1, wherein a plurality of said hydrostatic pressure cylinders are provided to said one holding head.

3. The contact arm for an electronic device testing apparatus as set forth in claim 2, wherein:

said floating mechanism includes a rod for supporting said holding head and a through hole formed on said drive mechanism side for said rod to penetrate; and said one rod is provided with said one hydrostatic pressure cylinder.

4. The contact arm for an electronic device testing apparatus as set forth in claim 3, wherein said rod is made removable from said drive mechanism.

5. The contact arm for an electronic device testing apparatus as set forth in claim 2, wherein at least a holding portion of an electronic device to be tested of said holding head is made removable.

6. The contact arm for an electronic device testing apparatus as set forth in claim 1, wherein:

said floating mechanism includes a rod for supporting said holding head and a through hole formed on said drive mechanism side for said rod to penetrate; and said one rod is provided with said one hydrostatic pressure cylinder.

7. The contact arm for an electronic device testing apparatus as set forth in claim 6, wherein said rod is made removable from said drive mechanism.

8. The contact arm for an electronic device testing apparatus as set forth in claim 1, wherein at least a holding portion of an electronic device to be tested of said holding head is made removable.

* * * * *